United States Patent
Rumney

(10) Patent No.: US 7,014,051 B2
(45) Date of Patent: Mar. 21, 2006

(54) APPARATUS AND METHOD FOR MOUNTING A COMPONENT IN A RACK

(75) Inventor: Gary Rumney, Leighton Buzzard (GB)

(73) Assignee: Sun Microsystems, Inc., Santa Clara, CA (US)

( * ) Notice: Subject to any disclaimer, the term of this patent is extended or adjusted under 35 U.S.C. 154(b) by 291 days.

(21) Appl. No.: 10/151,261

(22) Filed: May 20, 2002

(65) Prior Publication Data

US 2003/0213757 A1 Nov. 20, 2003

(51) Int. Cl.
*A47F 7/00* (2006.01)

(52) U.S. Cl. ....................................... 211/26
(58) Field of Classification Search .................. 211/26, 211/175, 26.2, 189, 190, 191, 192; 312/265.1, 312/223.1; 369/75.2
See application file for complete search history.

(56) References Cited

U.S. PATENT DOCUMENTS

| | | | |
|---|---|---|---|
| 3,182,805 A * | 5/1965 | Foster, Jr. et al. ............ 211/26 |
| 5,398,821 A * | 3/1995 | Vansant ......................... 211/26 |
| 5,571,256 A | 11/1996 | Good et al. | |
| 6,230,903 B1 | 5/2001 | Abbott | |
| 6,305,556 B1 | 10/2001 | Mayer | |
| 6,435,354 B1 * | 8/2002 | Gray et al. .................... 211/26 |
| 6,523,918 B1 * | 2/2003 | Baiza ....................... 312/265.1 |
| 6,629,614 B1 * | 10/2003 | Jordan ........................... 211/26 |

* cited by examiner

*Primary Examiner*—Sarah Purol
(74) *Attorney, Agent, or Firm*—Meyertons Hood Kivlin Kowert & Goetzel, P.C.; B. Noël Kivlin

(57) ABSTRACT

A slide includes a fixed portion comprising a rack-mounting ear capable of being attached to a rack and a first connecting ear and a telescoping portion slidably engaged with the fixed portion and comprising a second connecting ear capable of being joined with the first connecting ear. The telescoping portion is capable of being attached to a component enclosure. A method includes attaching a fixed portion of a slide to a rack, attaching a telescoping portion of the slide to a component enclosure, and slidably engaging the telescoping portion with the fixed portion. The method further includes moving the telescoping portion relative to the fixed portion in a first direction to retract the component enclosure into the rack and joining a connecting ear of the telescoping portion and a connecting ear of the fixed portion.

9 Claims, 8 Drawing Sheets

APPARATUS AND METHOD FOR MOUNTING A COMPONENT IN A RACK

BACKGROUND OF THE INVENTION

1. Field of the Invention

This invention relates to an apparatus and a method for mounting a component in a rack and, in particular, to an apparatus and a method for slidably mounting a component in a rack.

2. Description of the Related Art

In the interest of installation floor space economy, components of computer systems (e.g., central processing units, storage media drives, and the like) are often mounted in racks. Typically, such racks include vertically elongated, floor mounted cabinet assemblies of standard sizes that include a rectangular internal frame structure externally covered by removable panels and one or more horizontally pivotable access doors. It may be desirable from time to time for personnel to access these components to perform maintenance on and/or to reconfigure the components. Thus, such a component is typically mounted to the frame structure of the rack by slides so that the component may be readily moved between a forwardly extended component access position and a rearwardly retracted closed operating position.

To operatively mount the component in the rack, one portion of the slide is attached to the component enclosure and another portion of the slide is attached to the frame structure of the rack. These two portions are then mated such that they slidingly cooperate, thus allowing the component to be extended from and retracted into the rack. Typically, the component enclosure includes features, commonly referred to as "ears" or "flanges", which have openings therethrough adapted to receive fasteners for securing the component to the frame structure of the rack. When the fasteners are received through these openings and engaged with corresponding openings in the frame structure of the rack, the component is inhibited from inadvertently being extended from the rack.

If the spatial relationship between the component enclosure and the frame structure of the rack is not accurately maintained, the openings in the component enclosure ears or flanges may not be aligned with the corresponding openings in the frame structure of the rack. Thus, it may not be possible for the fasteners to be placed through the openings in the component enclosure ears or flanges and engaged with the openings in the frame structure of the rack to secure the component enclosure to the frame structure. Further, it may not be possible to move the component to another location within the rack, which is often desirable, since the component being moved may physically interfere with one or more other components mounted within the rack.

The present invention is directed to overcoming, or at least reducing, the effects of one or more of the problems set forth above.

SUMMARY OF THE INVENTION

In one aspect of the present invention, a slide is provided. The slide includes a fixed portion comprising a rack-mounting ear capable of being attached to a rack and a first connecting ear and a telescoping portion slidably engaged with the fixed portion and comprising a second connecting ear capable of being joined with the first connecting ear. The telescoping portion is capable of being attached to a component enclosure.

In another aspect of the present invention, a system is provided. The system includes a rack, a component enclosure, a first slide attached between a first side of the component enclosure and the rack, and a second slide attached between a second side of the component enclosure and the rack. Each of the first and the second slides includes a fixed portion comprising a rack-mounting ear attached to the rack and a first connecting ear and a telescoping portion slidably engaged with the fixed portion and comprising a second connecting ear capable of being joined with the first connecting ear. The telescoping portion is attached to the component enclosure.

In yet another aspect of the present invention, a method is provided. The method includes attaching a fixed portion of a slide to a rack, attaching a telescoping portion of the slide to a component enclosure, and slidably engaging the telescoping portion with the fixed portion. The method further includes moving the telescoping portion relative to the fixed portion in a first direction to retract the component enclosure into the rack and joining a connecting ear of the telescoping portion and a connecting ear of the fixed portion.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
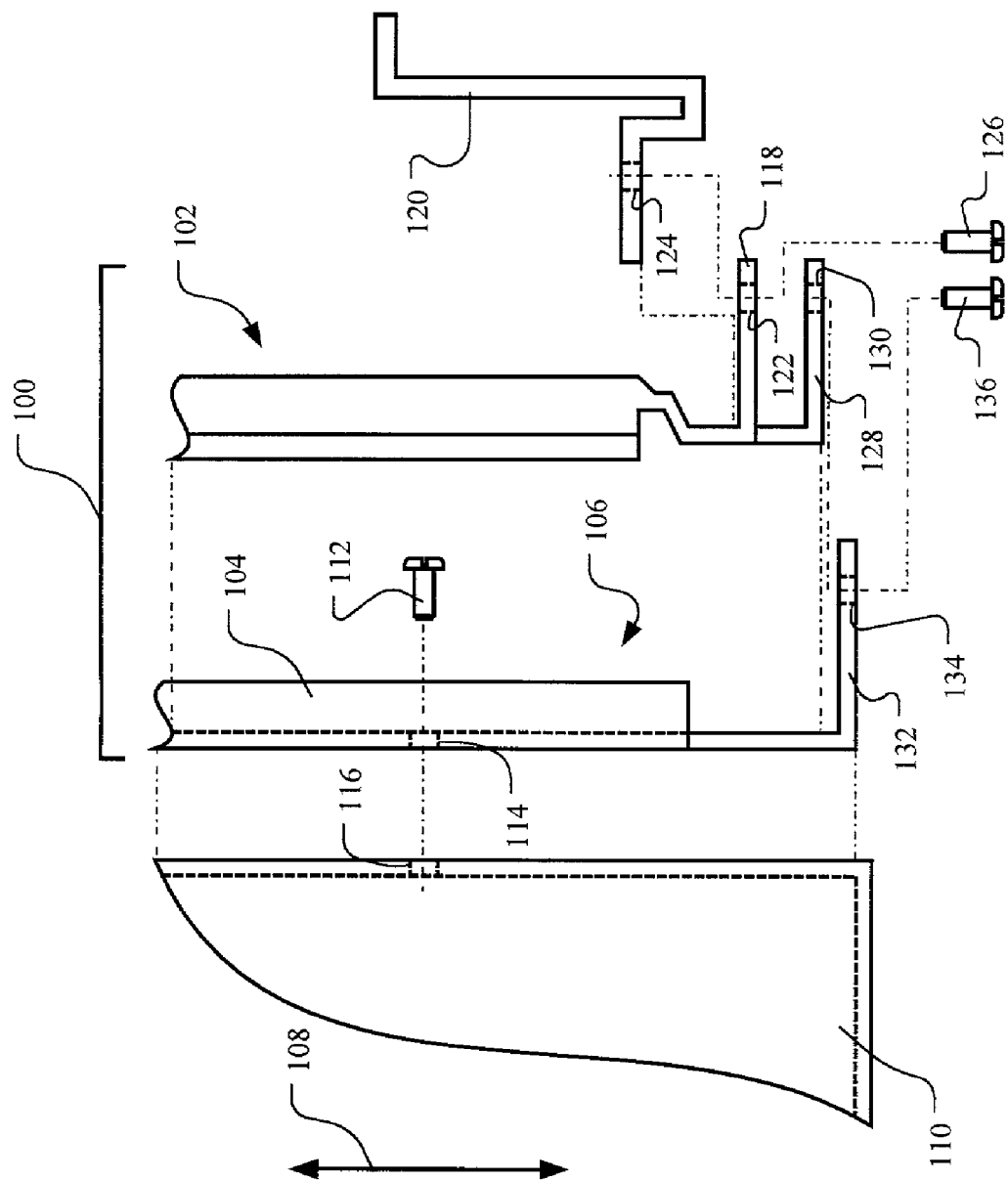
FIG. 1 is an exploded top, plan view of a first embodiment of a slide according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

Figure 2:
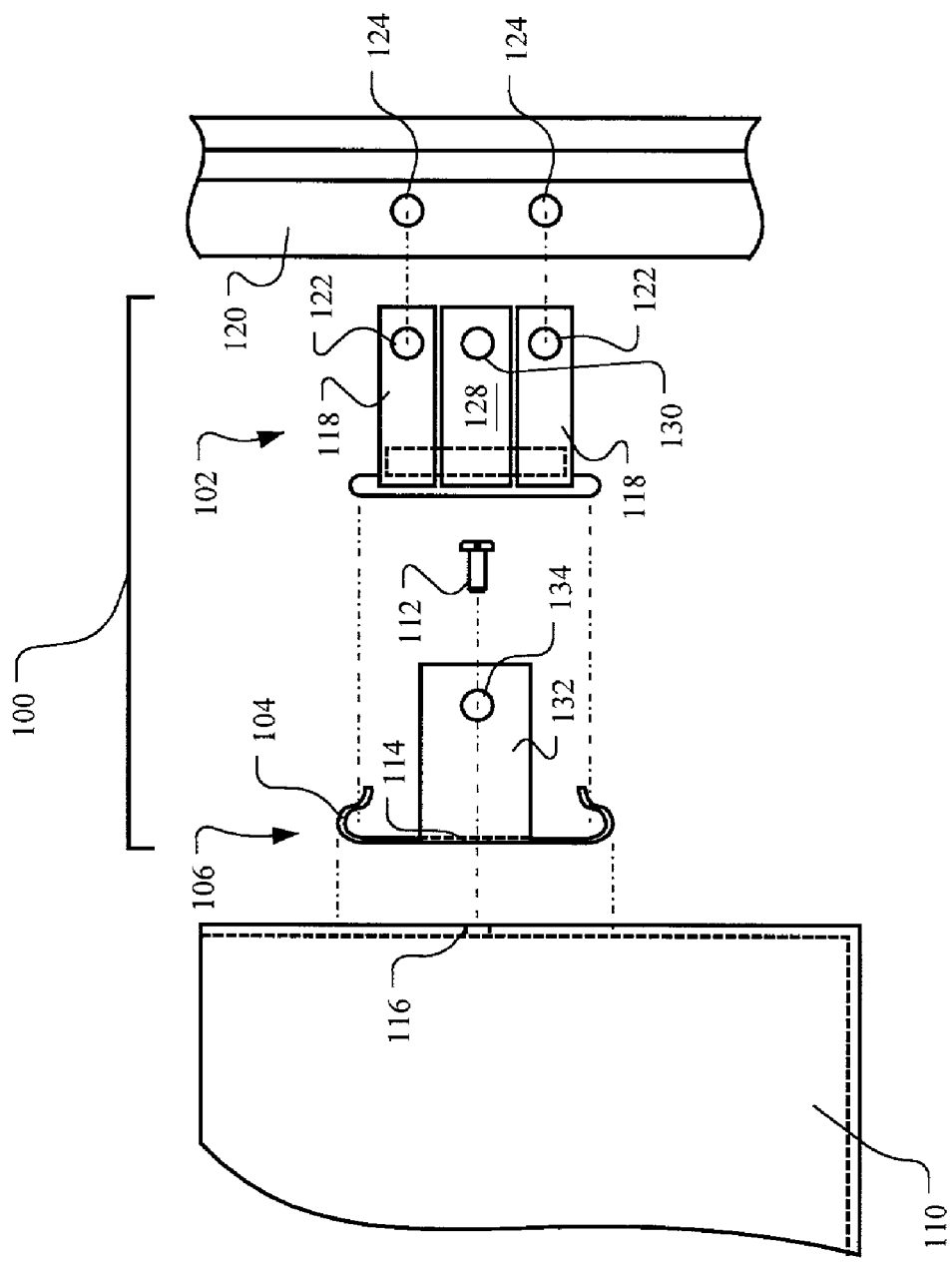
FIG. 2 is an exploded front, elevational view of the slide illustrated in FIG. 1.

FIGS. 1 and 2 partially illustrate an embodiment of a slide 100 according to the present invention. The slide 100 includes a fixed portion that is slidingly received within a guide 104 of a telescoping portion 106. The guide 104 allows the telescoping portion 106 to be moved inwardly and outwardly (indicted by the double-headed arrow 108) relative to the fixed portion 102 while inhibiting relative movement therebetween in other directions.

The telescoping portion 106 is attached to a component enclosure 110 by, for example, a plurality of screws 112. For ease of illustration and to avoid unnecessarily obscuring the instant invention, only one screw 112 is shown in FIG. 1 and the screws 112 are not depicted in FIG. 2. The plurality of screws 112 may be placed through a corresponding plurality of openings 114 (only one shown) defined by the telescoping portion 106 and threadedly engaged with a plurality of openings 116 (only one shown) defined by the enclosure 110. Alternatively, the telescoping portion 106 may be attached to the enclosure 110 by placing the screws 112 through the plurality of openings 114, 116, engaging nuts (not shown) with the screws 112, and tightening the nuts. The scope of the present invention, however, encompasses any way of attaching the telescoping portion 106 to the enclosure 110 known in the art.

Still referring to FIGS. 1 and 2, the fixed portion 102 comprises at least one rack-mounting ear 118 (two are shown in the illustrated embodiment) for attaching the fixed portion 102 to a rack 120. Each rack-mounting ear 114 defines an opening 122 therethrough, and the rack 120 defines a corresponding opening 124 therethrough. A screw 126 (not shown in FIG. 2) may be placed through the opening 122 through the rack-mounting ear 118 and threadedly engaged with the opening 124 through the rack 120 to attach the fixed portion 102 to the rack 120. Alternatively, the fixed portion 102 may be attached to the rack 120 by placing the screw 126 through the openings 122, 124, engaging a nut (not shown) with the screw 126, and tightening the nut. The invention is not so limited, however. The fixed portion 102 may be attached to the rack 120 by any way known in the art. While the rack 120 is illustrated as having a particular configuration, the scope of the present invention encompasses a rack having any configuration known in the art. Accordingly, the present invention includes any desired modifications to the rack-mounting ear 118 to accommodate various configurations of the rack 120.

The fixed portion 102 further includes a connecting ear 128 defining an opening 130 therethrough and the telescoping portion 106 includes a corresponding connecting ear 132 defining an opening 134 therethrough. The connecting ears 128, 132 may be joined by placing a screw 136 (not shown in FIG. 2) through the opening 130 and threadedly engaging the screw with the opening 134. Alternatively, the connecting ears 128, 132 may be joined by placing the screw 136 through the openings 130, 134, engaging a nut (not shown) with the screw 136, and tightening the nut. The scope of the present invention, however, includes any way of attaching the connecting ears 128, 132. Thus, when the connecting ears 128, 132 are joined, the telescoping portion 106 is inhibited from moving relative to the fixed portion 102 in the inward and outward directions (indicated by the double-headed arrow 108).

Figure 3:
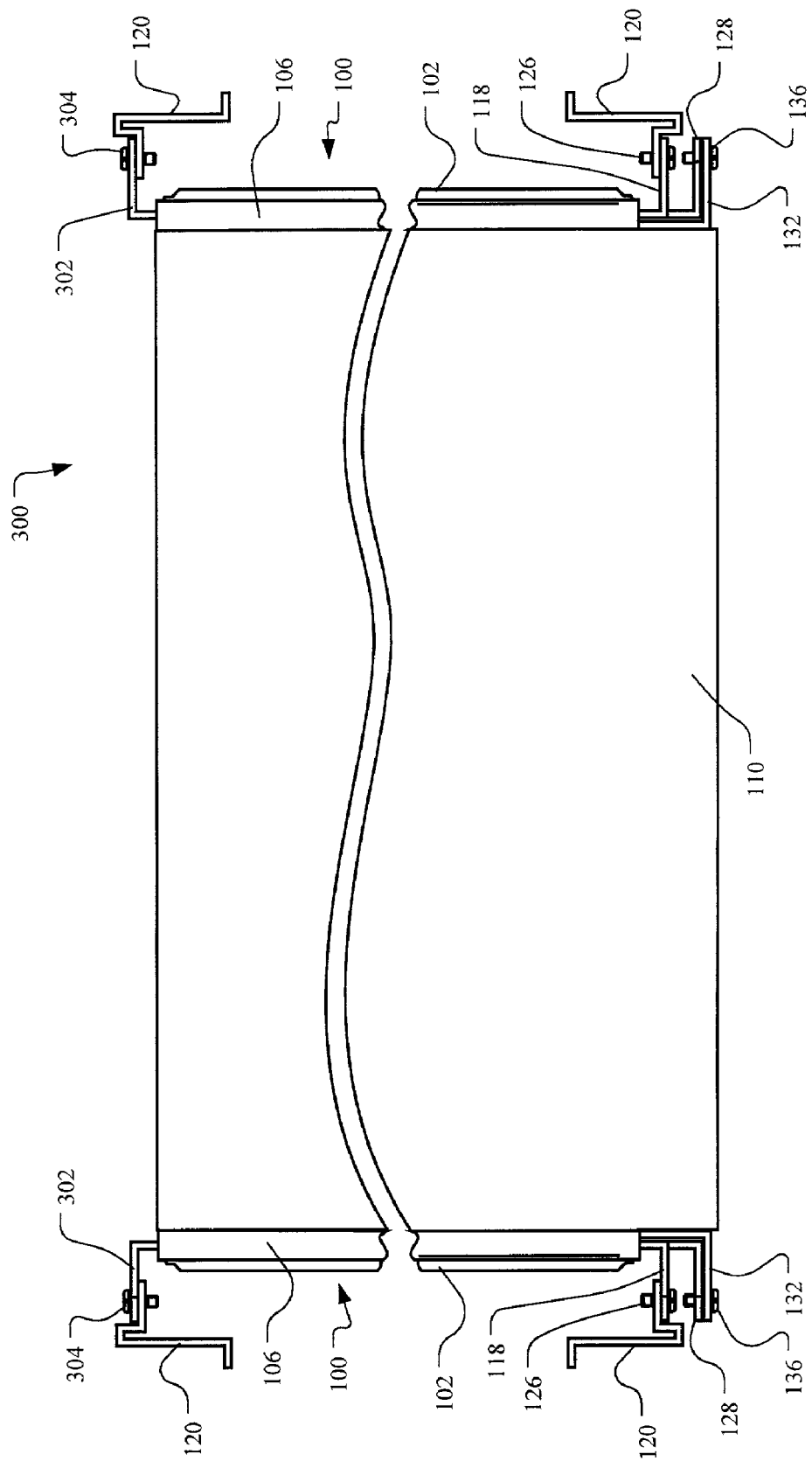
FIG. 3 is a top, plan view of a component mounted in a rack by the slide shown in FIGS. 1 and 2, wherein the component is in a retracted, operational position within the rack.
Figure 4:
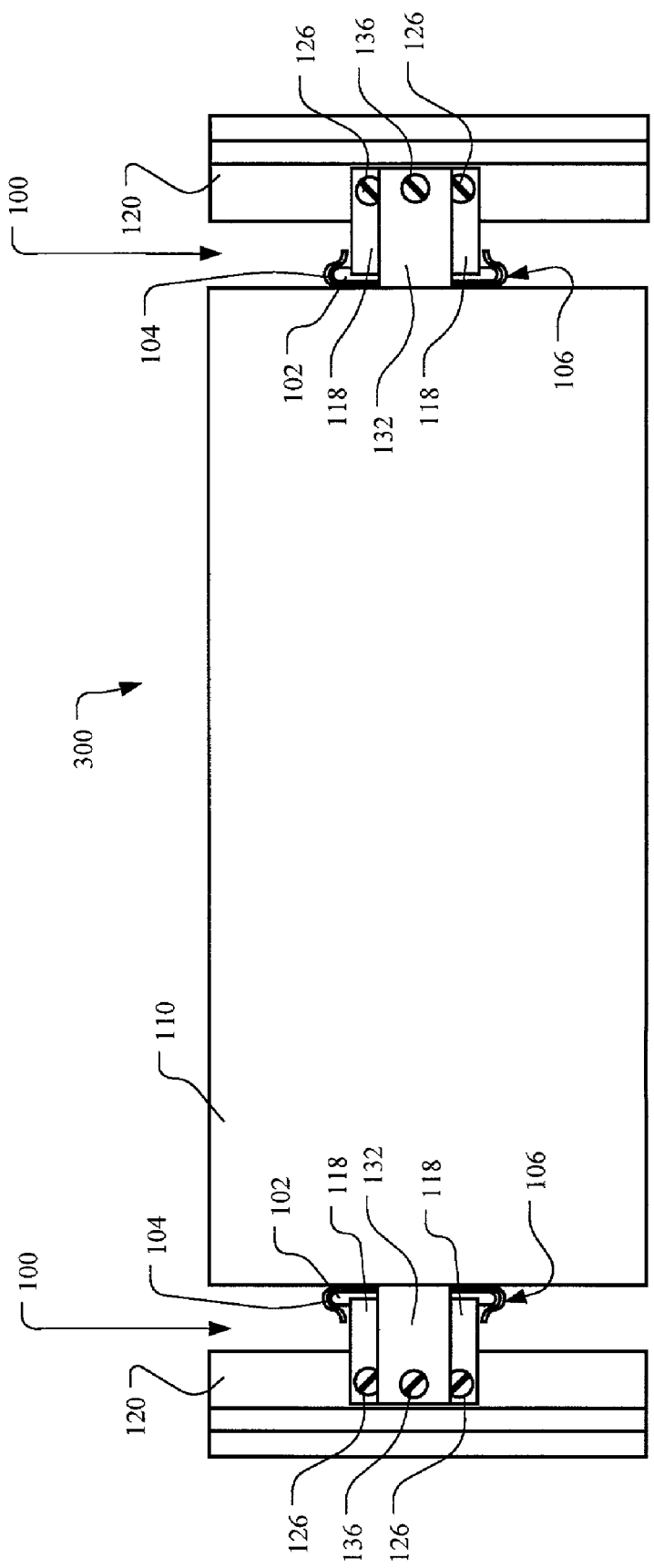
FIG. 4 is a front, elevational view of the component, rack, and slide of FIG. 3.
Figure 5:
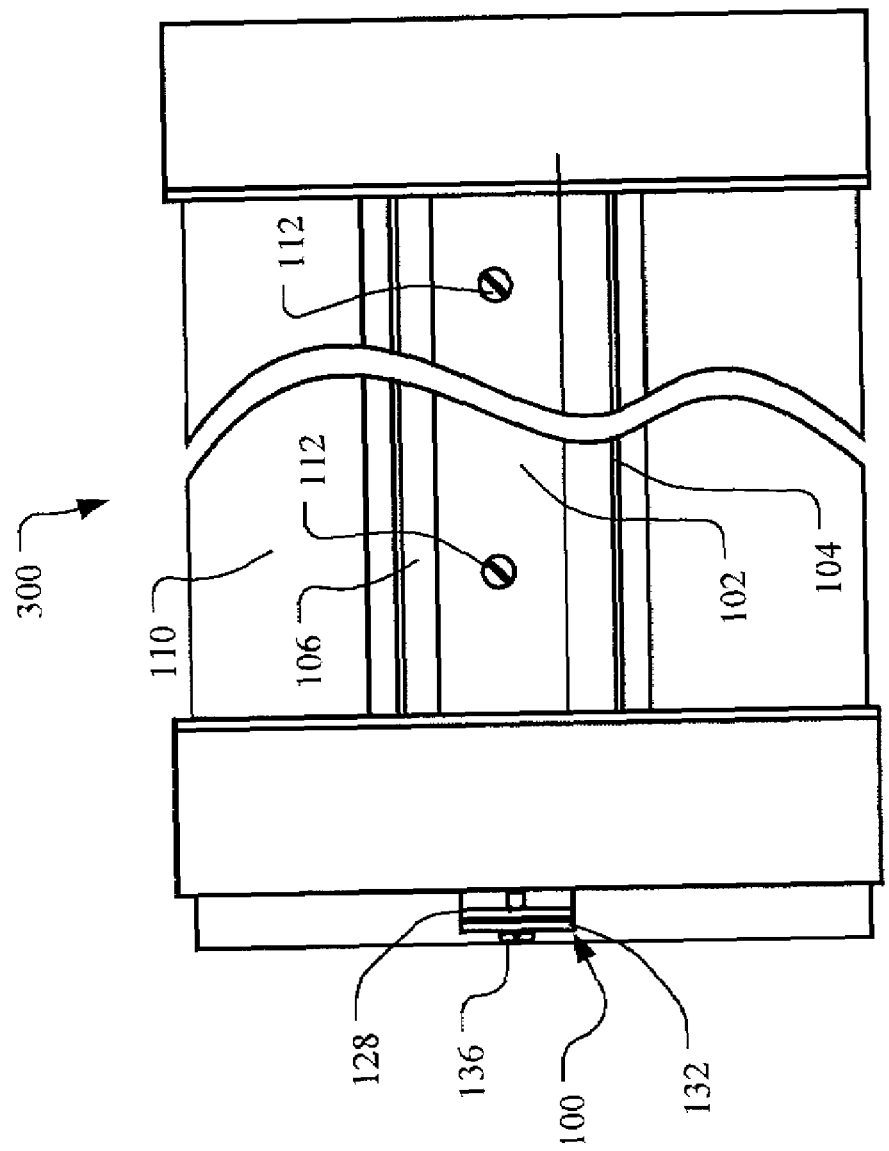
FIG. 5 is a side, elevational view of the component, rack, and slide of FIG. 3.

FIGS. 3–5 illustrate a system 300 wherein the enclosure 110 is mounted in the rack 120 with the slide 100. In addition to the attachments described previously, the fixed portion 102 also includes a rear ear 302 adapted to receive a screw 304 for attaching the fixed portion 102 to the rack 120. As in the other attachments, the screw 304 may be placed in an opening (not shown) through the rear ear 302 and threadedly engaged with the rack 120. Alternatively, the screw 304 may be placed through openings in the rear ear 302 and in the rack 120, a nut (not shown) engaged with the screw 304, and the nut tightened. The present invention is not so limited, however. The rear ear 302 may be attached to the rack 120 by any way known in the art. Thus, when the fixed portion 102 is slidingly received in the guide 104, the telescoping portion 106 is attached to the enclosure 110, the fixed portion 102 is attached to the rack 120, and the telescoping portion 106 is attached to the fixed portion 102 (i.e., the connecting ears 128, 132 are joined), a fixed relationship exists between the enclosure 110 and the rack 120.

Figure 6:
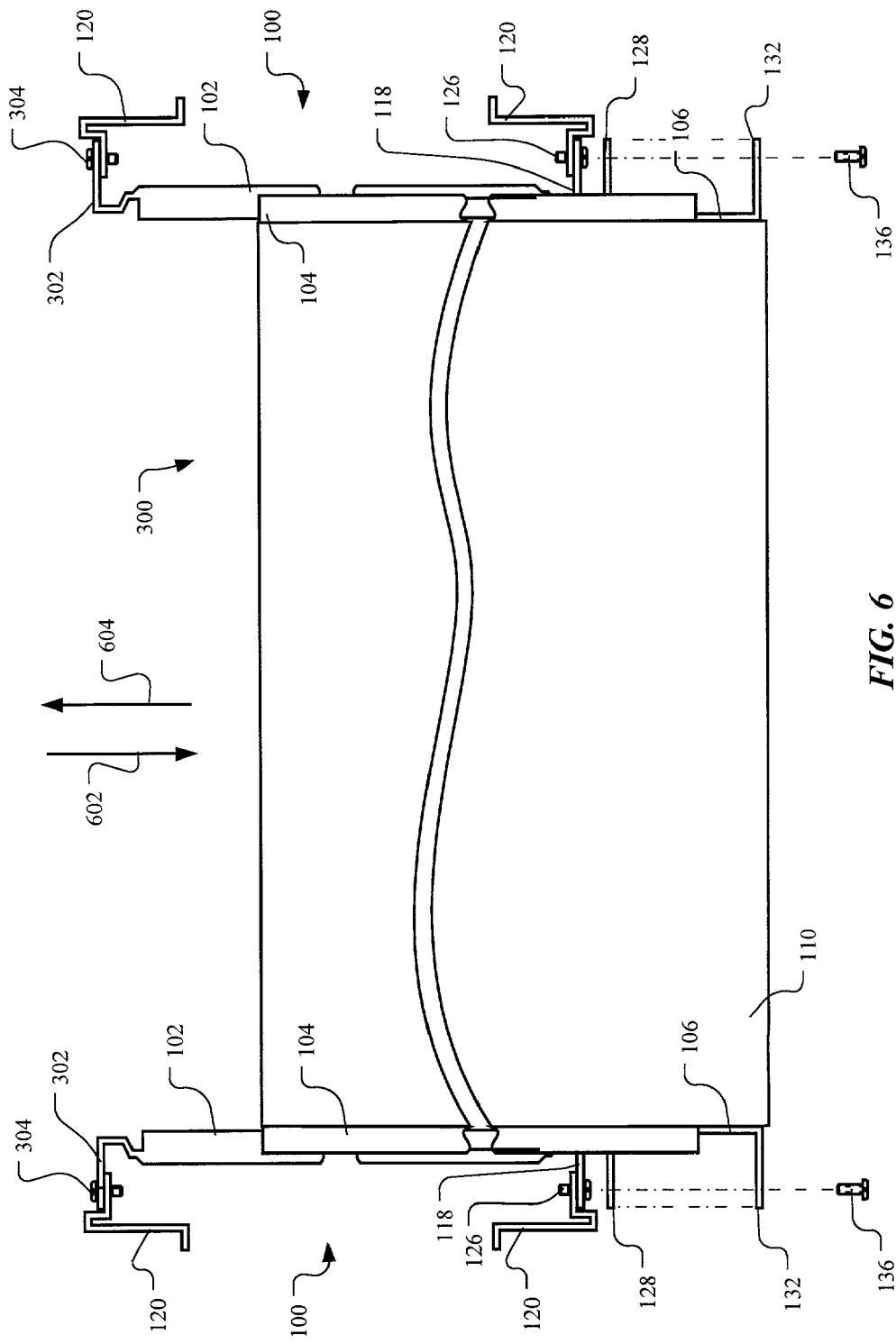
FIG. 6 is a top, plan view of the component, rack, and slide of FIG. 3, wherein the component is partially extended from the rack.
Figure 7:
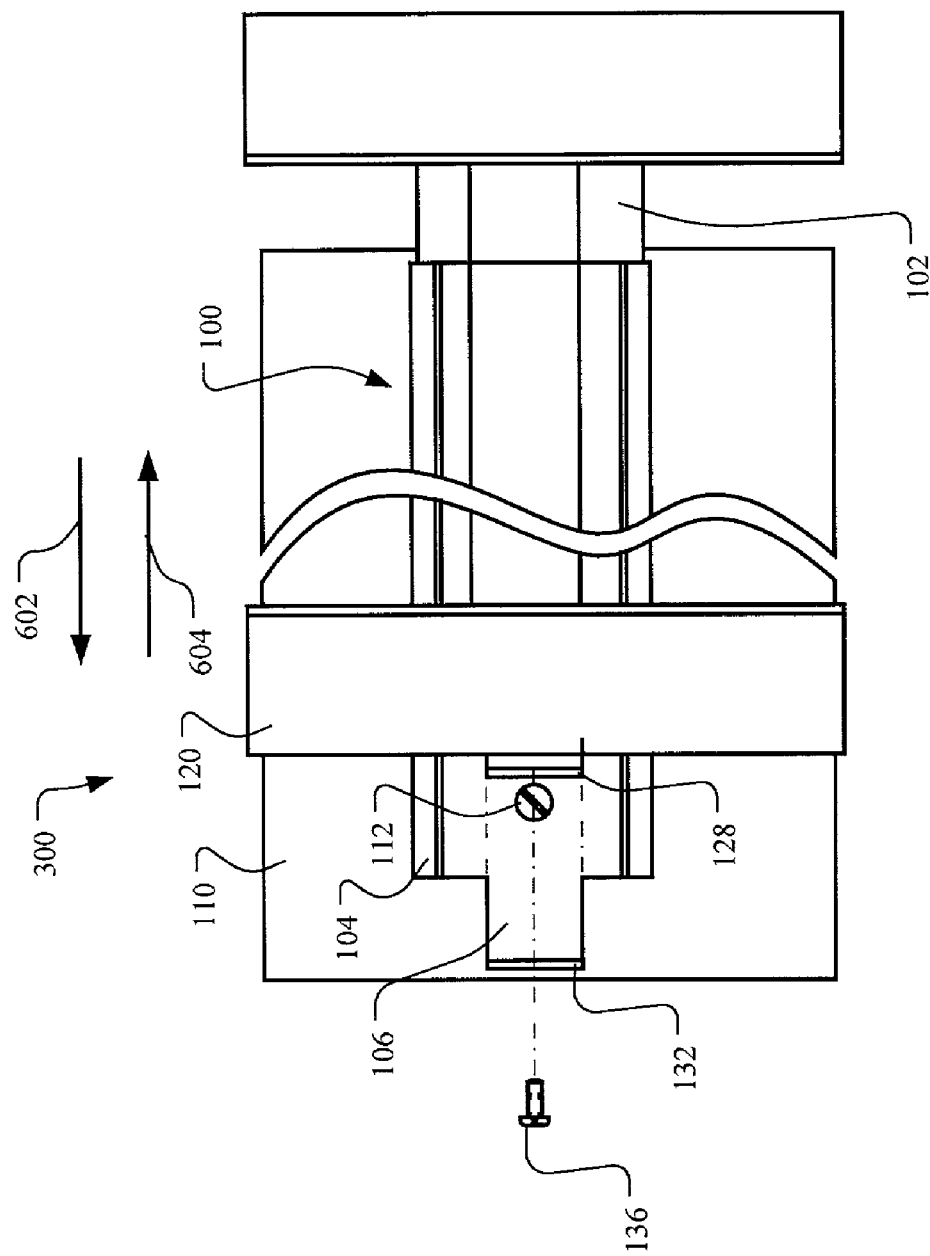
FIG. 7 is a side, elevational view of the component, rack, and slide of FIG. 6.

Referring now to FIGS. 6 and 7, the enclosure 110 may be extended from the rack 120 by removing the screws 136 from the connecting ears 128, 132 and slidably moving the telescoping portion 106 (attached to the enclosure 110) relative to the fixed portion 102 (attached to the rack 120) in a direction corresponding to the arrow 602. By fully extending the enclosure 110 from the rack 120, devices (not shown) contained within the enclosure 110 may be replaced, added, or serviced. The enclosure 110 may be moved to a retracted, operational position by slidably moving the enclosure 110 relative to the rack 120 (as indicated by the arrow 604) and replacing the screw 136. Further, the enclosure 110 may be completely removed from the rack 120 and, if desired, replaced in a different vertical location within the rack 120, wherein the rack 120 is equipped with another fixed portion 102.

Figure 8:
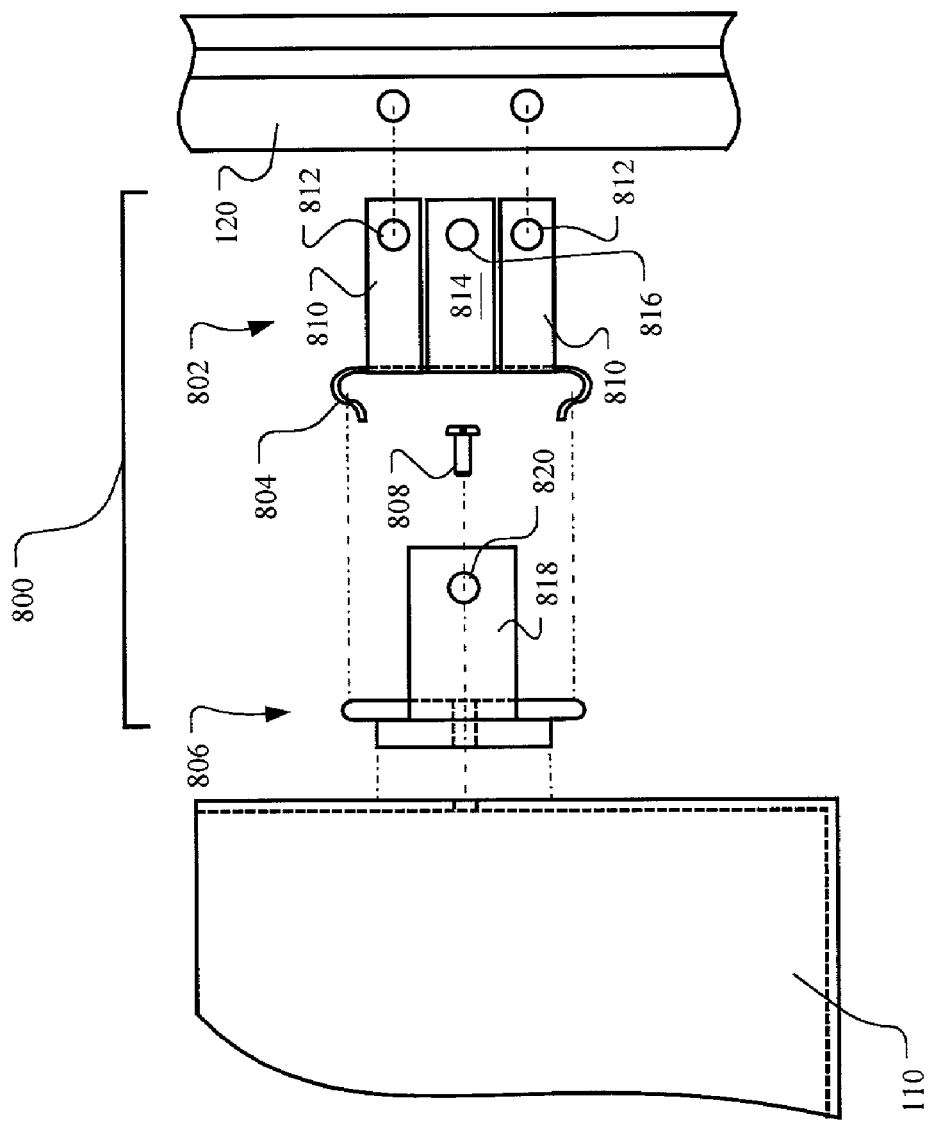
FIG. 8 is an exploded front, elevational view of a second embodiment of a slide according to the present invention.

While FIGS. 1–7 illustrate an embodiment of the present invention in which the telescoping portion 106 comprises the guide 104, the invention is not so limited. FIG. 8 illustrates a slide 800 including a fixed portion 802 having a guide 804. A telescoping portion 806 is slidingly received within the guide 804. As is the previous embodiment, the guide 804 allows the telescoping portion 806 to be moved inwardly and outwardly relative to the fixed portion while inhibiting relative movement therebetween in other directions.

Still referring to FIG. 8, the telescoping portion 806 is attached to the component enclosure 110 by a plurality of screws 808 (only one shown), as described previously. The fixed portion 802 comprises at least one rack-mounting ear 810 (two are shown in the illustrated embodiment) defining an opening 810 for attaching the fixed portion 802 to a rack 120, as described relative to the embodiment illustrated in FIGS. 1–7. The fixed portion 802 further includes a connecting ear 814 defining an opening 816 therethrough and the telescoping portion 806 includes a corresponding connecting ear 818 defining an opening 820 therethrough. The connecting ears 814, 818 may be joined as described relative to the embodiment illustrated in FIGS. 1–7.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A slide assembly, comprising:
a component enclosure;
a fixed portion comprising a rack-mounting ear, capable of being attached to a rack, and a first connecting ear; and
a telescoping portion slidably engaged with the fixed portion and comprising a second connecting ear capable of being joined with the first connecting ear,
wherein the telescoping portion is coupled to the component enclosure,
wherein, when the first connecting ear is fixedly coupled to the second connecting ear, the telescoping portion does not slide relative to the fixed portion;
wherein the fixed portion further comprises a guide and the telescoping portion is slidably received in the guide.

2. A slide assembly, comprising:
a component enclosure;
a fixed portion comprising a rack-mounting ear, capable of being attached to a rack, and a first connecting ear; and
a telescoping portion slidably engaged with the fixed portion and comprising a second connecting ear capable of being joined with the first connecting ear,
wherein the telescoping portion is coupled to the component enclosure,
wherein, when the first connecting ear is fixedly coupled to the second connecting ear, the telescoping portion does not slide relative to the fixed portion;
wherein the telescoping portion further comprises a guide and the fixed portion is slidably received in the guide.

3. A slide assembly, comprising:
a component enclosure;
a fixed portion comprising a rack-mounting ear, capable of being attached to a rack, and a first connecting ear; and
a telescoping portion slidably engaged with the fixed portion and comprising a second connecting ear capable of being joined with the first connecting ear,
wherein the telescoping portion is coupled to the component enclosure,
wherein, when the first connecting ear is fixedly coupled to the second connecting ear, the telescoping portion does not slide relative to the fixed portion;
wherein:
the rack mounting ear defines a first opening therethrough to receive a first screw for attaching the rack-mounting ear to the rack; and
the first connecting ear and the second connecting ear define second and third openings therethrough, respectively, to receive a second screw for joining the first and second connecting ears.

4. A slide assembly, comprising:
a component enclosure;
a fixed portion comprising a rack-mounting ear, capable of being attached to a rack, and a first connecting ear; and
a telescoping portion slidably engaged with the fixed portion and comprising a second connecting ear capable of being joined with the first connecting ear,
wherein the telescoping portion is coupled to the component enclosure,
wherein, when the first connecting ear is fixedly coupled to the second connecting ear, the telescoping portion does not slide relative to the fixed portion;
wherein the telescoping portion defines an opening therethrough adapted to receive a screw for attaching the telescoping portion to the component enclosure.

5. A slide assembly, comprising:
a component enclosure;
a fixed portion comprising a rack-mounting ear, capable of being attached to a rack, and a
first connecting ear; and
a telescoping portion slidably engaged with the fixed portion and comprising a second connecting ear capable of being joined with the first connecting ear,
wherein the telescoping portion is coupled to the component enclosure,
wherein, when the first connecting ear is fixedly coupled to the second connecting ear, the telescoping portion does not slide relative to the fixed portion;
wherein the fixed portion further comprises a rear ear capable of being attached to the rack;
wherein the rear ear defines an opening therethrough adapted to receive a screw for attaching the rear ear to the rack.

6. A system, comprising:
a rack;
a component enclosure;
a first slide attached between a first side of the component enclosure and the rack; and
a second slide attached between a second side of the component enclosure and the rack, wherein each of the first and the second slides comprises:
a fixed portion comprising a rack-mounting ear attached to the rack and a first connecting ear; and
a telescoping portion slidably engaged with the fixed portion and comprising a second connecting ear capable of being joined with the first connecting ear, wherein the telescoping portion is attached to the component enclosure;
wherein, when the second connecting ear is joined to the first connecting ear, the telescoping portion does not slide relative to the fixed portion.

7. The system, according to claim 6, wherein the fixed portion of each of the slides further comprises a guide and the corresponding telescoping portion of each of the slides is slidably received in the guide.

8. The system, according to claim 6, wherein the telescoping portion of each of the slides further comprises a guide and the corresponding fixed portion of each of the slides is slidably received in the guide.

9. The system, according to claim 6, wherein the fixed portion of each of the slides further comprises a rear ear capable of being attached to the rack.

* * * * *